(12) United States Patent
Chen et al.

(10) Patent No.: US 8,441,243 B2
(45) Date of Patent: May 14, 2013

(54) POWER CONTROL CIRCUIT, SWITCHING POWER CONVERTER, AND METHOD FOR REDUCING NOISE AND SWITCHING LOSS

(75) Inventors: Kun-Min Chen, Changhua County (TW); Ke-Tsung Chen, Kaohsiung (TW); Ching-Sheng Li, Hsinchu County (TW); Ming-Jung Tsai, Chang-Hua (TW)

(73) Assignee: Anpec Electronics Corporation, Hsin-Chu (TW)

( * ) Notice: Subject to any disclaimer, the term of this patent is extended or adjusted under 35 U.S.C. 154(b) by 289 days.

(21) Appl. No.: 13/025,120

(22) Filed: Feb. 10, 2011

(65) Prior Publication Data

US 2012/0176111 A1 Jul. 12, 2012

(30) Foreign Application Priority Data

Jan. 6, 2011 (TW) .............................. 100100494 A (51) Int. Cl.
*G05F 1/40* (2006.01)
(52) U.S. Cl.
USPC ....................................................... 323/282

(58) Field of Classification Search ................... 323/222, 323/225, 271, 282–284, 351
See application file for complete search history.

(56) References Cited

U.S. PATENT DOCUMENTS

| 7,026,798 | B2 * | 4/2006 | Cheung et al. ................ 323/225 |
| 7,808,222 | B2 * | 10/2010 | Ueunten ....................... 323/271 |
| 8,063,613 | B2 * | 11/2011 | Briere et al. .................. 323/222 |
| 8,080,985 | B2 * | 12/2011 | Ueunten ....................... 323/282 |

* cited by examiner

*Primary Examiner* — Adolf Berhane
(74) *Attorney, Agent, or Firm* — Winston Hsu; Scott Margo (57) ABSTRACT

Power control circuit with reducing noise and switching loss includes a first gate driver for driving a first switch, an additional gate driver for driving the first switch, and a managing circuit for controlling the first and the additional gate driver to drive the first switch according to a switching signal and turning off the additional gate driver according to a switching voltage on a first end of the first switch, wherein the first end of the first switch is coupled to a load, second end of the first switch is coupled to an input power source, a third end of the first switch is coupled to the first and the additional gate drivers.

22 Claims, 13 Drawing Sheets

POWER CONTROL CIRCUIT, SWITCHING POWER CONVERTER, AND METHOD FOR REDUCING NOISE AND SWITCHING LOSS

BACKGROUND OF THE INVENTION

1. Field of the Invention

The present invention relates to a power control circuit, and more particularly, to a power control circuit capable of reducing noise and switching loss of a switching power converter.

2. Description of the Prior Art

Figure 1:
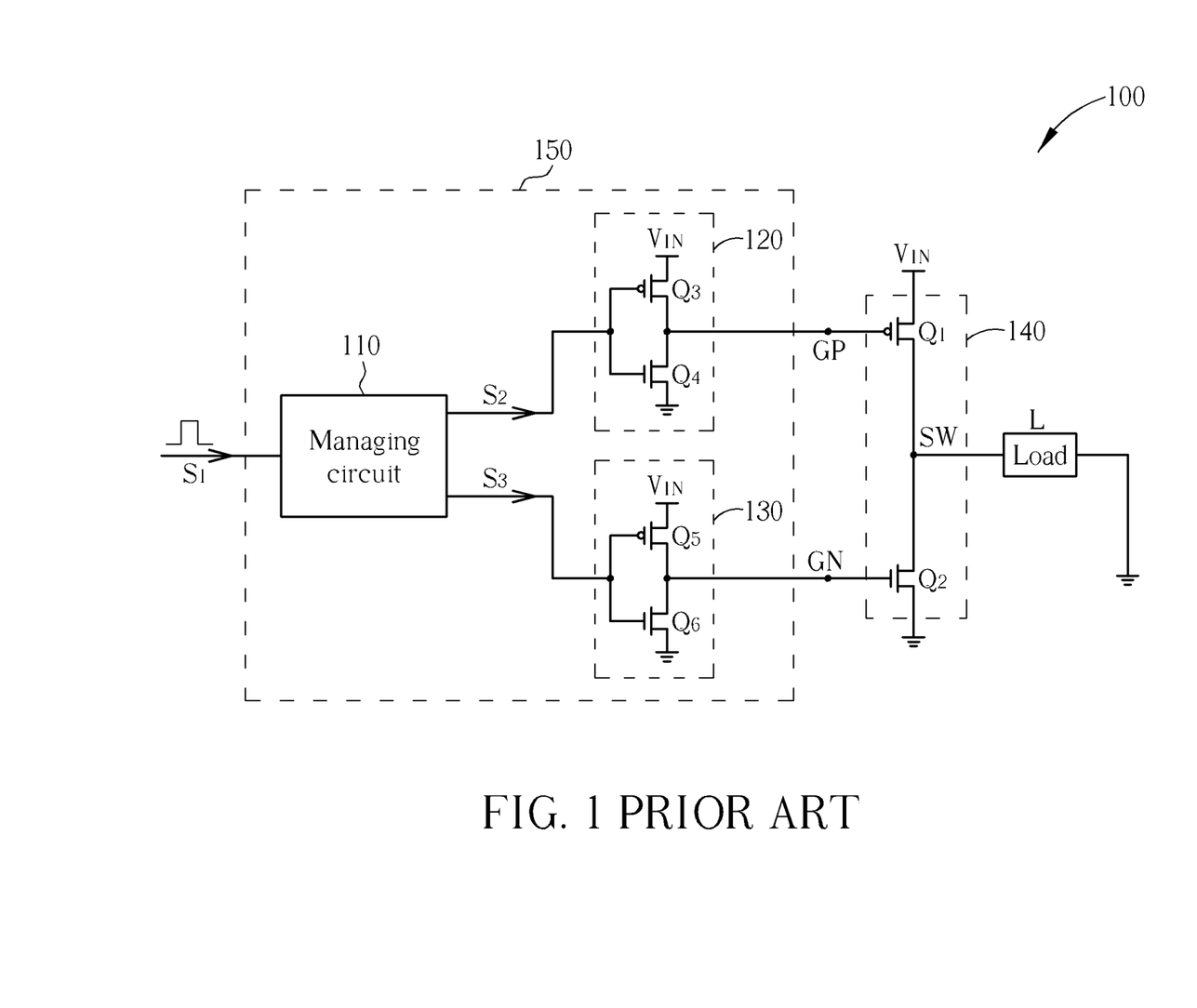
FIG. 1 is a diagram illustrating a conventional switching power converter.

Please refer to FIG. 1. FIG. 1 is a diagram illustrating a conventional switching power converter 100. As shown in FIG. 1, the switching power converter 100 comprises a load L, a switch set 140, and a power control circuit 150. The switch set 140 comprises two switches Q1 and Q2. The power control circuit 150 comprises a managing circuit 110, and two gate drivers 120 and 130. Besides, the switches Q1 and Q2 can be P type Metal Oxide Semiconductor (PMOS) transistor and N type Metal Oxide Semiconductor (NMOS) transistor respectively; the gate drivers 120 and 130 may be inverters; the load L may be resistive load, inductive load, or motor. In the switching power converter 100, the power control circuit 150 controls switch set 140 so that the input power source VIN can drive the load through the switch set 140.

The managing circuit 110 generates control signals S2 and S3 to drive the transistors Q1 and Q2 respectively through the gate drivers 120 and 130 according to a switching signal 51. More particularly, when the switching signal 51 represents "on", e.g. high level, the managing circuit 110 controls the transistor Q1 to be turned on through the gate driver 120 and controls the transistor Q2 to be turned off through the gate driver 130; when the switching signal 51 represents "off", e.g. low level, the managing circuit 110 controls the transistor Q1 to be turned off through the gate driver 120 and controls the transistor Q2 to be turned on through the gate driver 130.

Figure 2:
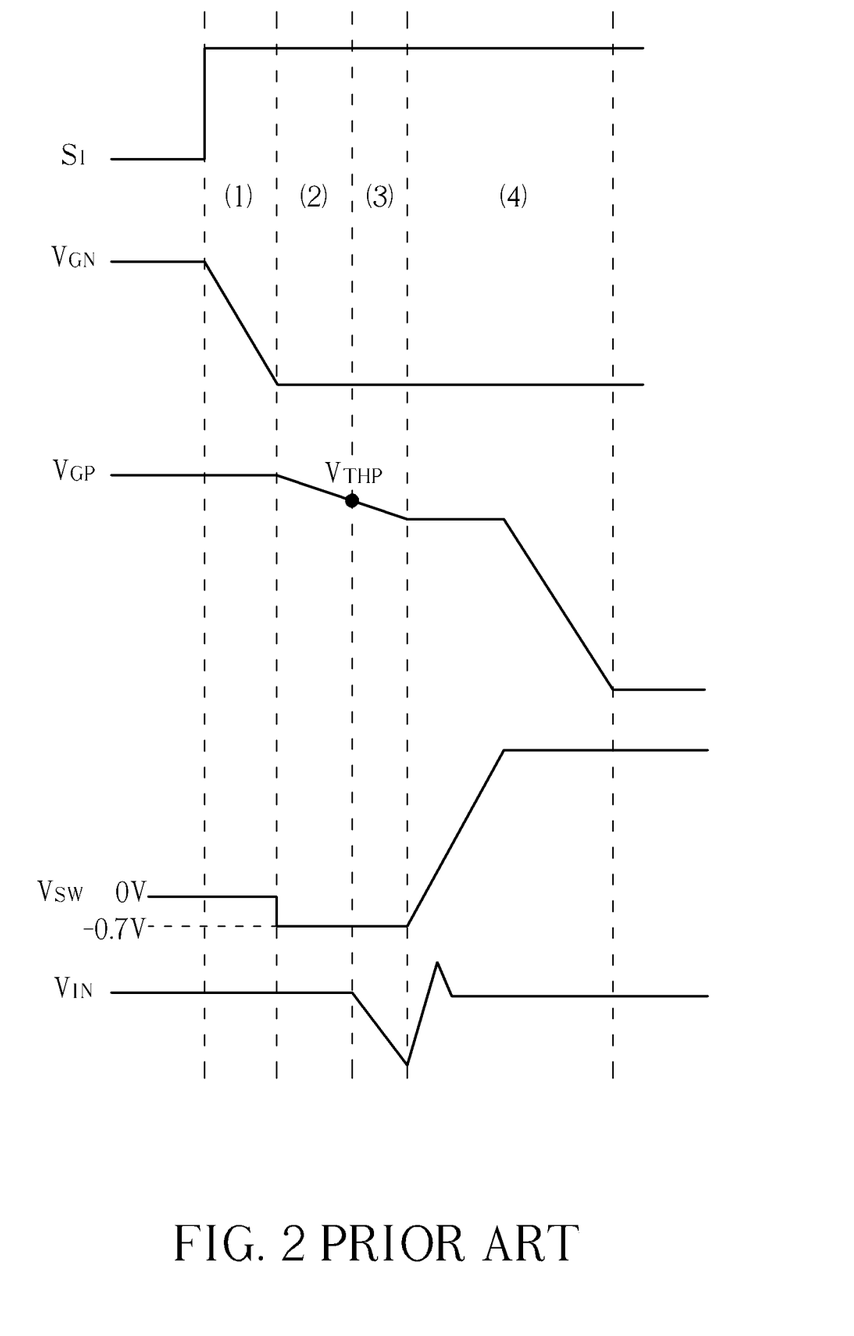
FIG. 2 is a timing diagram illustrating changes of related signals of the power control circuit 150 after the switching signal changes from the low level to the high level.
Figure 3:
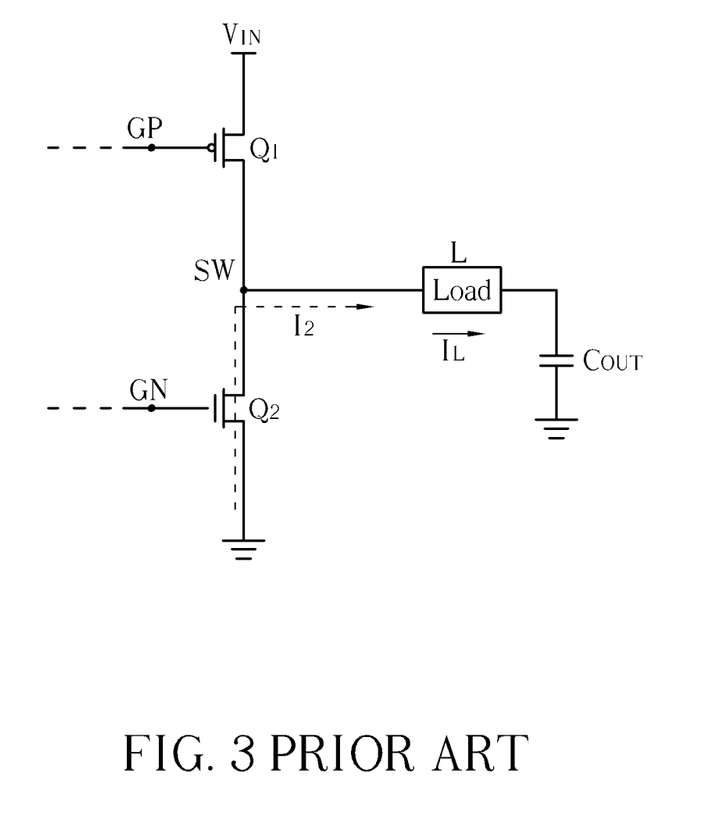
FIGS. 3, 4, 5, and 6 are diagrams illustrating the current paths of the switch set of the prior art respectively corresponding to the periods during the switching phase.
Figure 4:
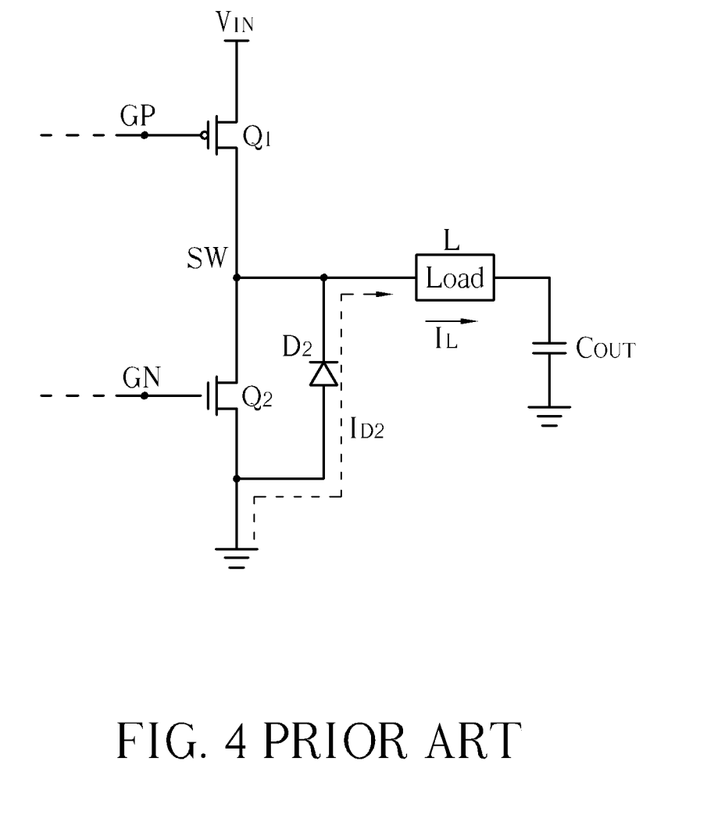
Figure 5:
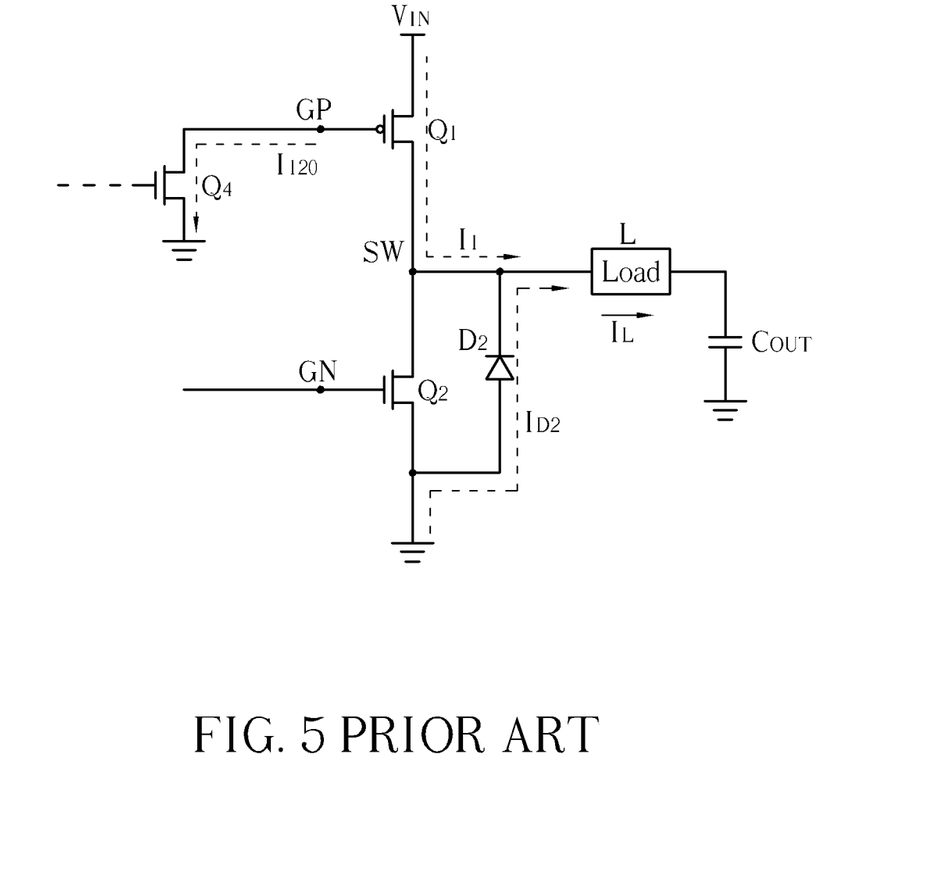
Figure 6:
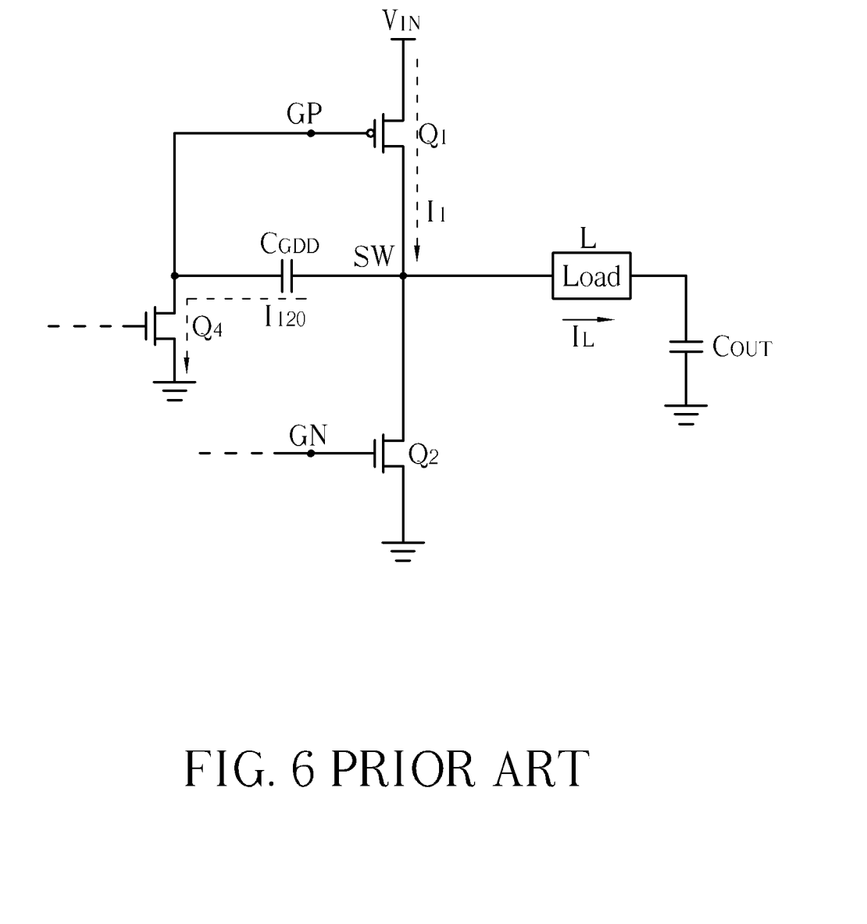

Please refer to FIG. 2, and together with FIG. 3 to FIG. 6. FIG. 2 is a timing diagram illustrating changes of related signals of the power control circuit 150 after the switching signal S1 changes from the low level to the high level. As shown in FIG. 2, time after the switching signal 51 changes to the high level is divided into four periods (1), (2), (3), and (4). FIGS. 3, 4, 5, and 6 are diagrams illustrating the current paths of the switch set 140 respectively corresponding to the periods (1), (2), (3), and (4) during the switching phase. In FIG. 2, VGP represents gate voltage of the transistor Q1 (the node GP), VGN represents gate voltage of the transistor Q2 (the node GN), VGP represents the switching voltage (the node SW), VIN represents the voltage of the input power source VIN. After the switching signal 51 changes from the low level to the high level, the gate voltages VGP and VGN start to drop, the transistor Q1 starts to turn on, and the transistor Q2 starts to turn off.

In the period (1) of FIG. 2, the gate voltage VGN starts to fall down to zero so that the transistor Q2 is gradually turned off; the gate voltage VGP still remains the high voltage level. By the end of the period (1), the gate voltage VGN has fallen down to zero volt so that the transistor Q2 is turned off completely. It can be seen from the corresponding FIG. 3 that the current IL of the load L is only provided by the transistor Q2 not turned off yet (the current I2), which means IL=I2, and thus the voltage level on the node SW (the switching voltage VSW) is clamped at zero voltage (ground voltage).

In the period (2) of FIG. 2, the gate voltage VGN remains at zero volt so that the transistor Q2 remains turned off; the gate voltage VGP still starts to fall down but the transistor Q1 still remains turned off. By the end of the period (2), the gate voltage VGP has fallen down to the threshold voltage VTHP so that the transistor Q1 is turned on gradually. It can be seen from the corresponding FIG. 4 that the current IL of the load L is only provided by the intrinsic diode D2 of the transistor Q2 (the current ID2), which means IL=ID2, and thus the voltage level on the node SW (the switching voltage VSW) is clamped by the diode D2 at its forward voltage, e.g. −0.7 volt.

In the period (3) of FIG. 2, the gate voltage VGN remains at zero volt so that the transistor Q2 remains turned off; since the gate voltage VGP has fallen down below the threshold voltage VTHP so that the transistor Q1 still remains turned off. By the end of the period (2), the gate voltage VGP has fallen down to the threshold voltage VTHP so that the transistor Q1 is turned on. It can be seen from the corresponding FIG. 5 that the current IL of the load L is provided by the transistor Q1 (current I1) and the intrinsic diode D2 of the transistor Q2 (the current ID2), which means IL=I1+ID2, and thus the voltage level on the node SW (the switching voltage VSW) is still clamped by the diode D2 at its forward voltage, e.g. −0.7 volt. Besides, the transistor Q4 of the gate driver 120 is turned on, and keeps draining current from the gate of the transistor Q1 by the current I120 so that the gate voltage VGP keeps falling down, causing the size of the current I1 of the transistor Q1 keeps rising, wherein the rising speed of the current I1 is controlled by the current I120. That is, the bigger the size of the current I120 is, the faster the falling speed of the gate driving voltage VGP, as well as the rising speed of the current I1. During this period, since the size of the current I1 rises, and the size of the current IL remains unchanged, the size of the current I2 falls down. In other words, by the end of the period (3), I1=IL, and the current ID2 provided by the diode D2 drops to zero, which means the diode D2 is off and the switching voltage starts to rise without being clamped by the diode D2.

In the period (4) of FIG. 2, the gate voltage VGN remains at zero volt so that the transistor Q2 remains turned off. It can be seen from the corresponding FIG. 6 that the transistor Q4 of the gate driver 120 conducts the current I120, which means the current flowing through the intrinsic capacitor CGDP is I120. Therefore, the switching voltage VSW rises due to the charging on the intrinsic capacitor CGDP and the rising speed is I120/CGDP.

It is noticeable that in the period (3) of FIG. 2, the transistor Q1 changes from turned-off to turned-on for the input power source VIN conducting the current I1 to the load L. Consequently, the stability of the input power source VIN is affected, which means noises will be generated on the input power source VIN. If turning-on speed of the transistor Q1 becomes faster, then the rising speed of the current I1 becomes faster as well, which causes the noises on the input power source VIN become bigger. In other words, if the size of the current I120 of the transistor Q4 of the gate driver 120 is bigger, the noises become bigger. On the opposite aspect, if the size of the current I120 is smaller, then the noises become smaller as well.

Moreover, in the period (4) of FIG. 2, the rising speed of the switching voltage VSW is controlled by the transistor Q4 of the gate driver 120 (I120/CGDP, wherein CGDP is constant), and the transistor Q1 keeps consuming power during this period. If the size of the current I120 is smaller, then the rising speed become smaller, causing the period (4) to become longer and thus the power consumed by the transistor Q1 become more. On the opposite aspect, if the size of the current is bigger, then the power consumed by the transistor Q1 become less.

From the above description, it can be concluded that in the conventional power control circuit, if the switching loss is to reduce, then the noises on the input power source become bigger; on the other hand, if the noises on the input power source are to reduce, then the switching loss become more. As a result, the conventional power control circuit cannot reduce the switching loss and the noises at the same time, causing inconvenience.

SUMMARY OF THE INVENTION

The present invention provides a power control circuit for reducing noise and switching loss. The power control circuit comprises a first gate driver for driving a first switch; an additional gate driver for driving the first switch; and a managing circuit for controlling the first and the additional gate drivers to drive the first switch according to a switching signal and disabling the additional gate driver according to a switching voltage on a first end of the first switch; wherein the first end of the first switch is coupled to a load, a second end of the first switch is coupled to a first power source, and a third end of the first switch is coupled to the first and the additional gate drivers.

The present invention further provides a switching power converter for reducing noise and switching loss. The switching power converter comprises a switch set, comprising a first switch comprising a first end coupled to a load; a second end coupled to a first power source; a third end; and a power control circuit, comprising a first gate driver coupled to the third end of the first switch for driving the first switch; an additional gate driver coupled to the third end of the first switch for driving the first switch; and a managing circuit for controlling the first and the additional gate drivers to drive the first switch according to a switching signal and disabling the additional gate driver according to a switching voltage on the first end of the first switch.

The present invention further provides a method for reducing noises and switching loss of a switching power converter. The method comprises detecting a switching voltage between a switch set of the switching power converter and a load; and adjusting driving volume for the switch set of the switching power converter according to the switching voltage.

These and other objectives of the present invention will no doubt become obvious to those of ordinary skill in the art after reading the following detailed description of the preferred embodiment that is illustrated in the various figures and drawings.

DETAILED DESCRIPTION

Figure 7:
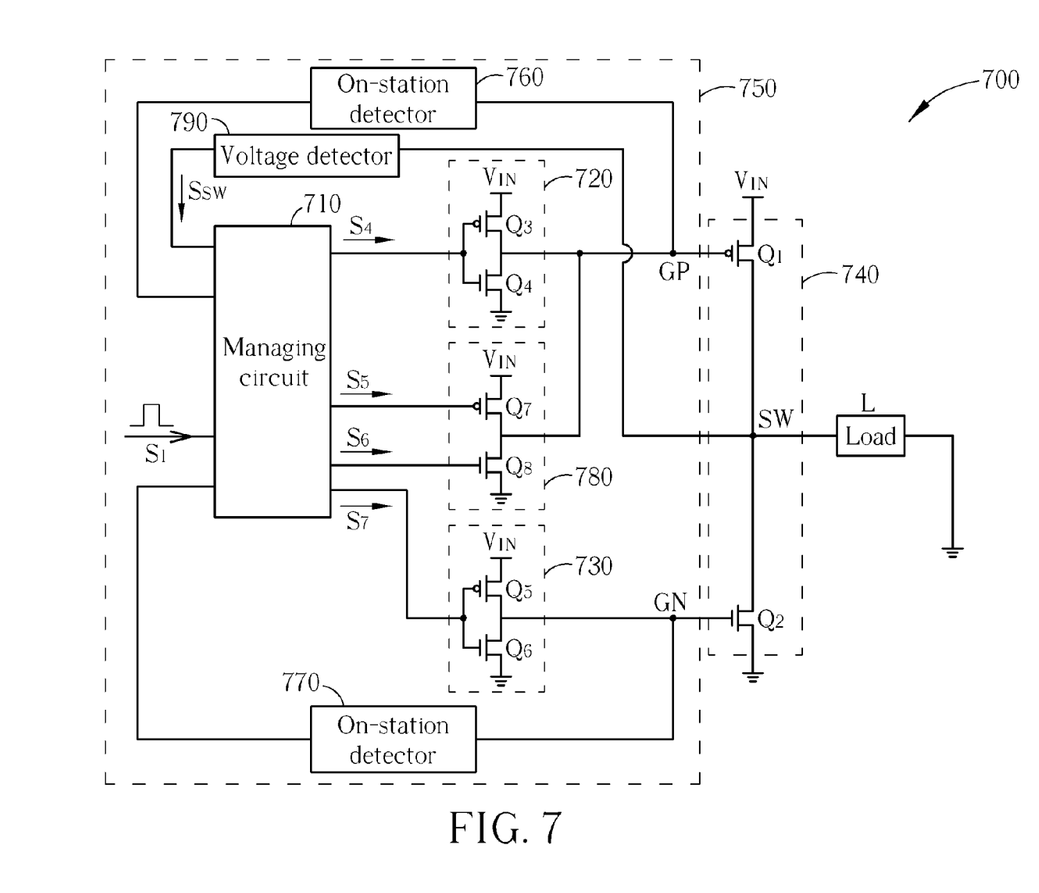
FIG. 7 is a diagram illustrating a switching power converter of the present invention.

Please refer to FIG. 7. FIG. 7 is a diagram illustrating a switching power converter 700 of the present invention. As shown in FIG. 7, the switching power converter 700 comprises a load L, a switch set 740, and a power control circuit 750. The switch set 740 comprises two switches Q1 and Q2. The power control circuit 750 comprises a managing circuit 710, two on-station detectors 760 and 770, a voltage detector 790, and two gate drivers 720 and 730, and an additional gate driver 780. Besides, the switches Q1 and Q2 can be PMOS transistor and NMOS transistor respectively; the gate drivers 720 and 730 may be inverters; the load L may be resistive load, inductive load, or motor. The additional gate driver 780 comprises a PMOS transistor Q7 and an NMOS transistor Q8. In the switching power converter 700, the power control circuit 750 controls switch set 740 so that the input power source VIN can drive the load through the switch set 740.

The managing circuit 710 generates control signals S4 and S7 to drive the transistors Q1 and Q2 respectively through the gate drivers 720 and 730 according to a switching signal S1. Compared to the prior art, the difference is on the voltage detector 790 which detects the switching voltage VSW and accordingly generates the detecting signal SSW. Preferably, the voltage detector 790 generates the detecting signal SSW when detecting the switching voltage VSW is higher than a predetermined value. The managing circuit 710 further generates control signals S5 and S6 to control the additional gate driver 780 for further driving the transistor Q1 according to the switching S1 and the detecting signal SSW.

More particularly, when the switching signal S1 represents "on", e.g. high level, the managing circuit 710 controls the transistor Q1 to be turned on through the gate driver 720 and controls the transistor Q2 to be turned off through the gate driver 730; when the switching signal S1 represents "off", e.g. low level, the managing circuit 710 controls the transistor Q1 to be turned off through the gate driver 720 and controls the transistor Q2 to be turned on through the gate driver 730. Furthermore, the managing circuit 710 enables the gate driver 780 for enhancing the speed of the transistor Q1 switching to on/off state with the current I780 according to the status of the switching signal S1 (representing "on" or "off"). Additionally, the threshold value VSW_TH can be explained as the voltage value of the switching voltage VSW at the moment that changes of the currents on the transistors Q1/Q2 are generated, which means the current rises up from zero amp, or falls down to zero). In this embodiment, the transistor Q1 is taken as an example.

Figure 8:
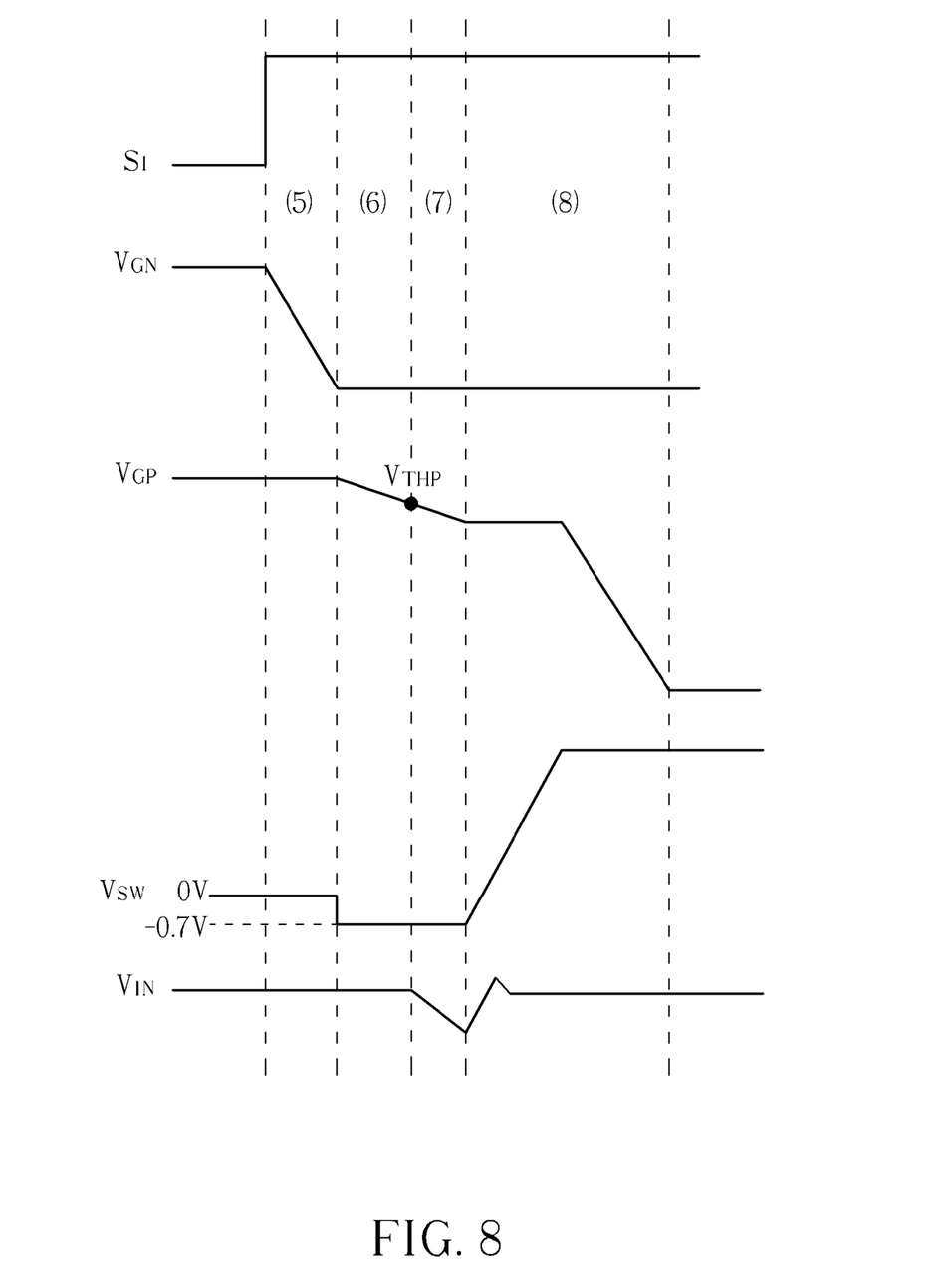
FIG. 8 is a timing diagram illustrating changes of related signals of the power control circuit 750 of the present invention after the switching signal changes from the low level to the high level.
Figure 9:
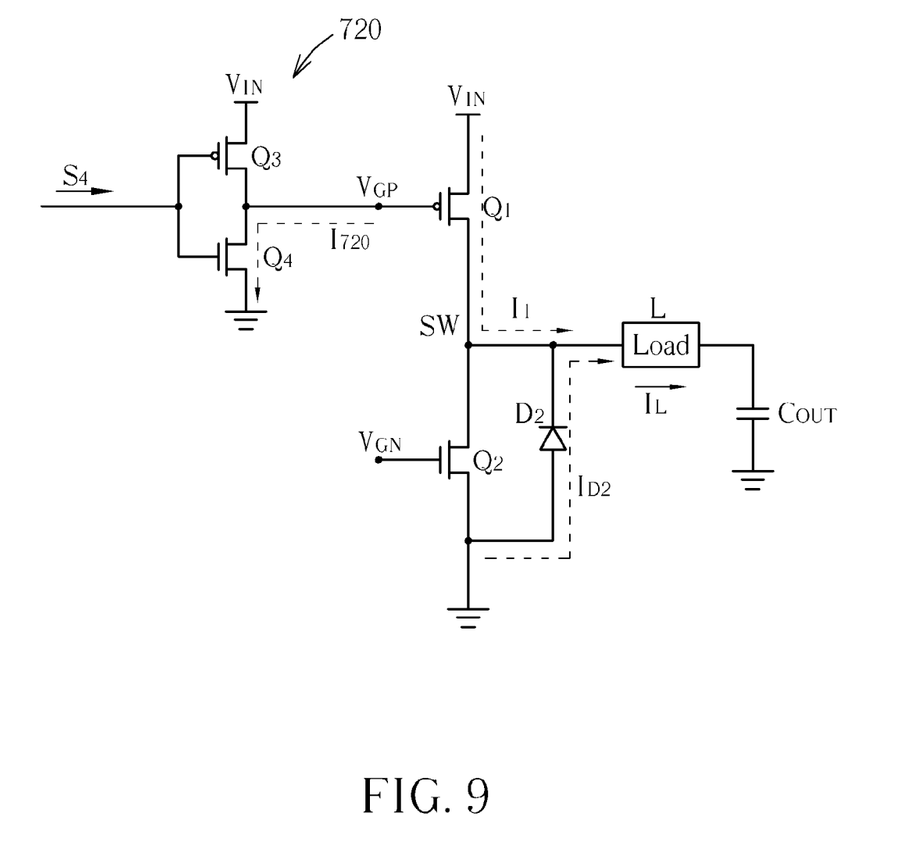
FIGS. 9 and 10 are diagrams illustrating the current paths of the switch set of the present invention respectively corresponding to the periods during the switching phase.
Figure 10:
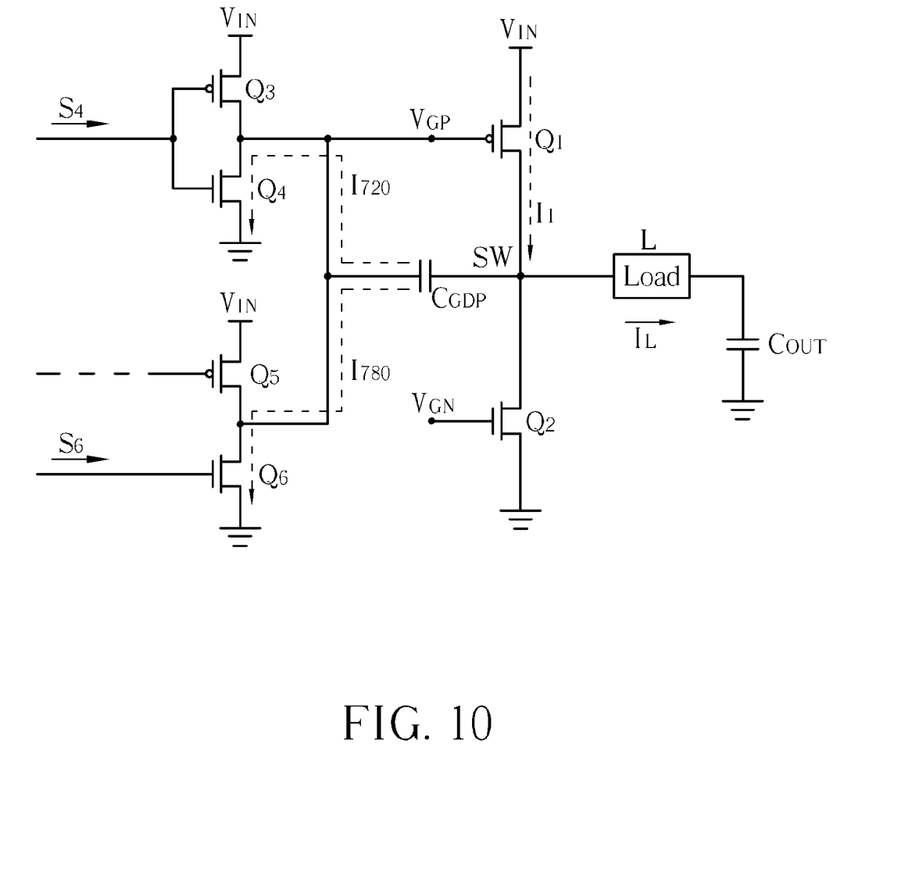
Figure 11:
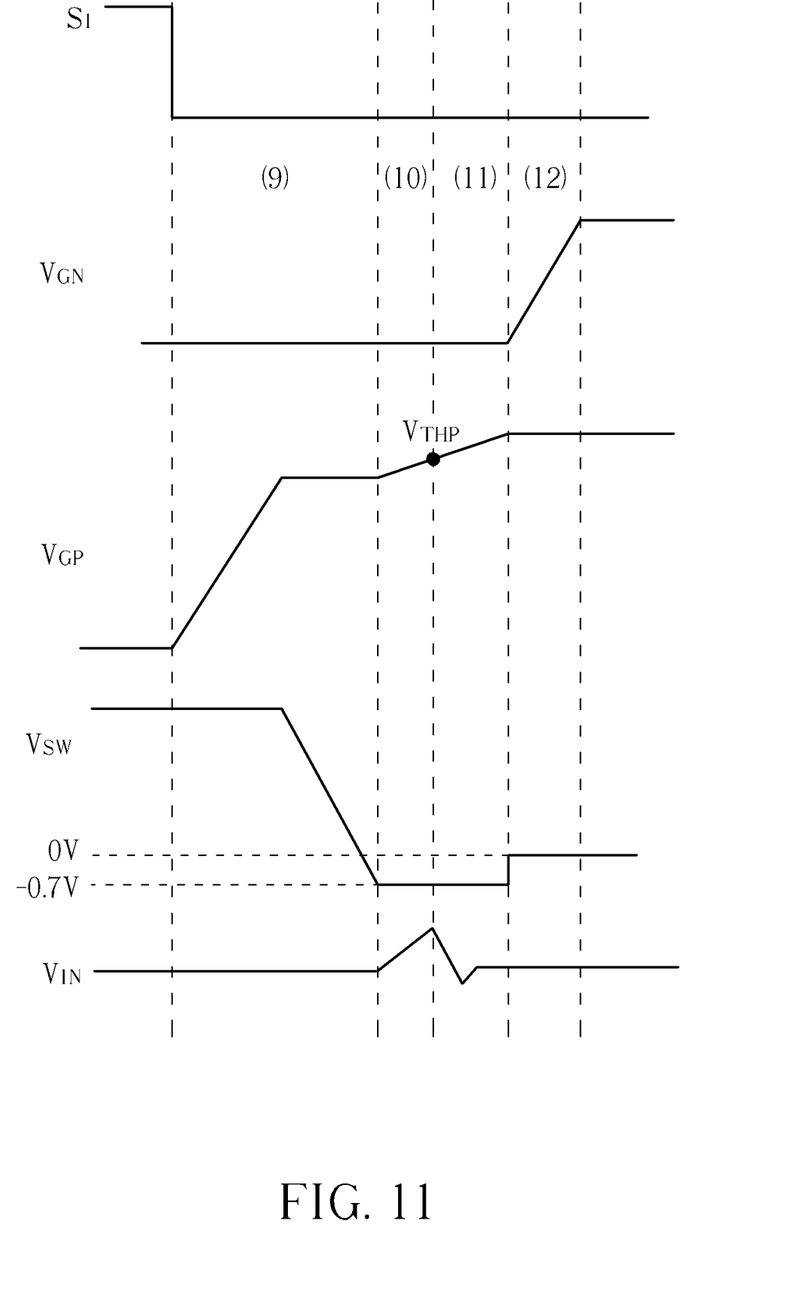
FIG. 11 is a timing diagram illustrating changes of related signals of the power control circuit 750 of the present invention after the switching signal changes from the low level to the high level.
Figure 12:
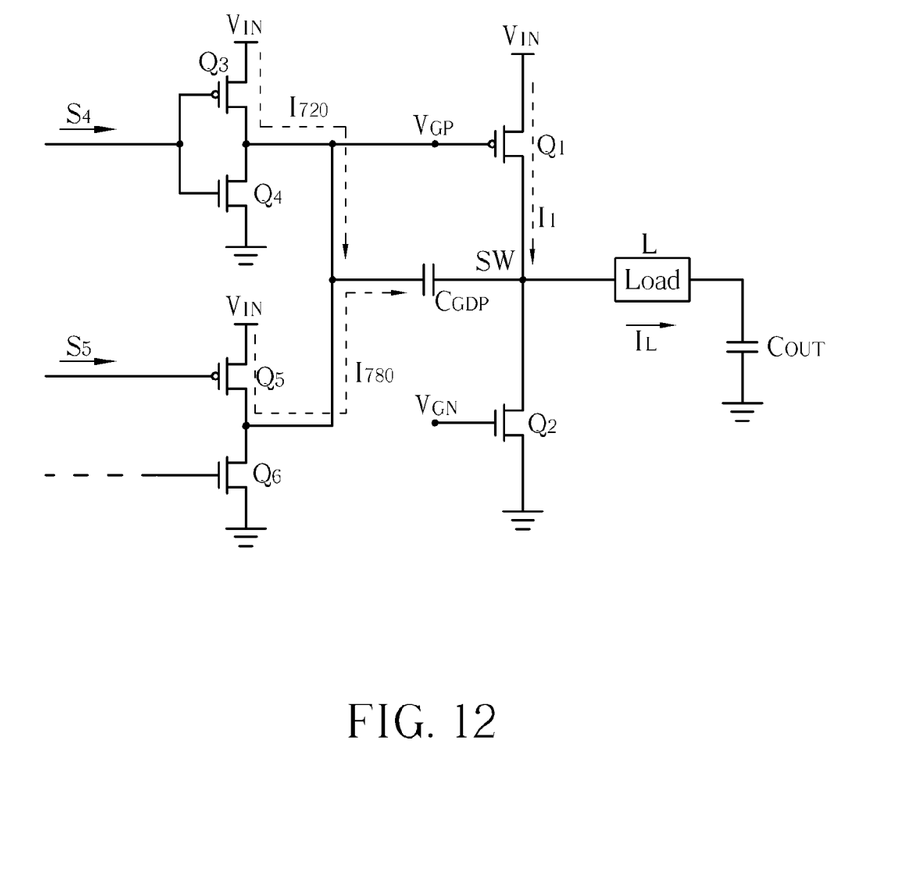
FIGS. 12 and 13 are diagrams illustrating the current paths of the switch set of the present invention respectively corresponding to the periods during the switching phase.
Figure 13:
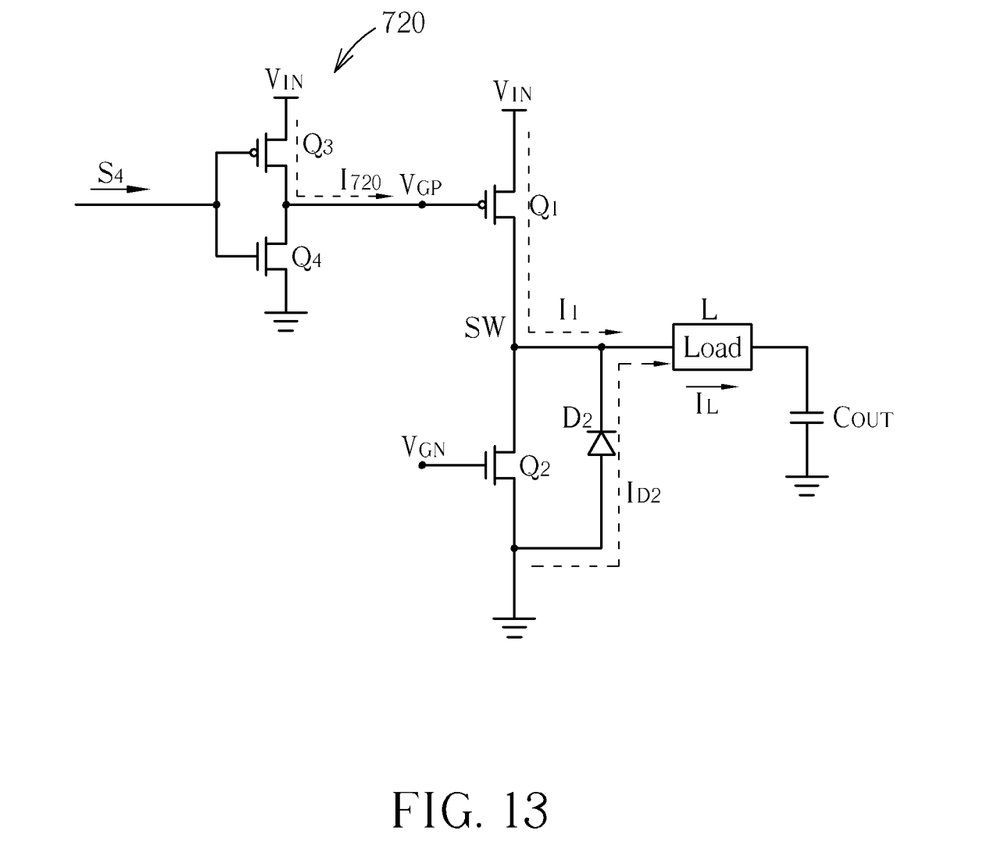

In the following description, the operating principles are respectively explained according to the status of the switching signal S1. FIG. 8 to FIG. 10 and related description focus on the switching signal S1 changing from the low level to the high level. FIG. 11 to FIG. 13 and related description focus on the switching signal S1 changing from the high level to the low level.

Please refer to FIG. 8, and together with FIG. 9 to FIG. 10. FIG. 8 is a timing diagram illustrating changes of related signals of the power control circuit 750 of the present invention after the switching signal S1 changes from the low level to the high level. As shown in FIG. 8, time after the switching signal S1 changes to the high level is divided into four periods (5), (6), (7), and (8). FIGS. 9 and 10 are diagrams illustrating the current paths of the switch set 740 respectively corresponding to the periods (7) and (8) during the switching phase. In FIG. 8, VGP represents gate voltage of the transistor Q1 (the node GP), VGN represents gate voltage of the transistor Q2 (the node GN), VGP represents the switching voltage (the node SW), VIN represents the voltage of the input power source VIN. After the switching signal S1 changes from the low level to the high level, the gate voltages start to drop, the gate voltages VGP and VGN star to drop so that the transistor Q1 starts to turn on, and the transistor Q2 starts to turn off. Besides, the operation principles of the periods (5) and (6) are similar to those of the periods (1) and (2) and thus are omitted for brevity.

In the period (7) of FIG. 8, according to the description related to the period (3), and accompanied with FIG. 9, it can be known that the transistor Q4 of the gate driver 720 is turned on and drains current from the gate of the transistor Q1 by the current I720. Different from the prior art, the present invention may design the size of the current I720 to be smaller so as to slow down the speed of the transistor Q1 draining the current I1 from the input power source VIN. In this way, the noises on the input power source VIN can be effectively reduced.

Please refer to FIG. 11, and together with FIG. 12 to FIG. 13. FIG. 11 is a timing diagram illustrating changes of related signals of the power control circuit 750 of the present invention after the switching signal S1 changes from the low level to the high level. As shown in FIG. 11, time after the switching signal S1 changes to the high level is divided into four periods (9), (10), (11), and (12). FIGS. 12 and 13 are diagrams illustrating the current paths of the switch set 740 respectively corresponding to the periods (9), and (10) during the switching phase. After the switching signal S1 changes from the high level to the low level, the gate voltages VGP and VGN start to rise, the transistor Q1 starts to turn off, and the transistor Q2 starts to turn on. Besides, the operation principles of the periods (11) and (12) are similar to those of the periods (2) and (1) and thus are omitted for brevity.

In the period (9) of FIG. 11, according to the description related to the period (4), and accompanied with FIG. 12, it can be known that originally the rising speed of the switching voltage VSW is I720/CGDP. However, the managing circuit 710 enables the additional gate driver 780 during the period (12) to drive the transistor Q1 by the current I780. Therefore, the current flowing through the intrinsic capacitor CGDP is raised up to (I720+I780), and the rising speed of the switching voltage VSW becomes (I720+I780)/CGDP. The present invention may design the size of the current I780 to be bigger so as to enhance the rising speed of the switching voltage VSW. In this way, the switching loss caused by the transistor Q1 can be effectively reduced. More particularly, the managing circuit 710 generates the control signal S6 to turn on the transistor Q5 of the additional driver 780 for generating the current I780 according to the switching signal S1 and the detecting signal SSW.

In the period (10) of FIG. 11, according to the description related to the period (3), and accompanied with FIG. 13, it can be known that the transistor Q3 of the gate driver 720 is turned on and providing current to the gate of the transistor Q1 by the current I720 to raise the voltage VGP for gradually turning off the transistor Q1. Different from the prior art, the present invention may design the size of the current I720 to be smaller so as to slow down the speed of the transistor Q1 draining the current I1 from the input power source VIN. In this way, the noises on the input power source VIN can be effectively reduced.

Simply to say, usually the additional gate driver 780 is turned-off (disabled), and only enabled by the managing circuit 710 in the periods (8) and (12) for raising the current driving the transistor Q1 up to (I720+I780). Thus, in the periods (7) and (11), the transistor Q1 is only driven by the current I720 of the gate driver 720; in the periods (8) and (12), the transistor Q1 is driven by the current I720 of the gate driver 720 together with the current I780 of the additional gate driver 780. From the above description, it is understood that the driving current has to be smaller in the periods (7) and (10) for reducing the noises so that the current I720 can be designed to be smaller; the driving current has to be bigger in the periods (8) and (9) for reducing the switching loss so that the current I780 can be designed to be bigger. In this way, the power control circuit 750 can reduce the noises and the switching loss at the same time by adjusting the driving currents.

Additionally, the on-station detectors 760 and 770 are utilized for detecting if the transistors Q1 and Q2 are turned on respectively and accordingly transmit the detecting result to the managing circuit 710. This disposition is mainly for avoiding the transistors Q1 and Q2 turning on at the same time, causing the input power source VIN directly coupled to the ground end and a rush current to be generated.

On the other hand, though in the switching power converter 700, only the transistor Q1 is taken for example, in the actual circuit application, the driving object can be changed to the transistor Q2, and the actual circuit mainly is symmetrical to the related components of the switching power converter 700, which is well-known to those skilled in the art and the related description is omitted for brevity.

To sum up, the present invention determines the status of the switching power converter and accordingly adjusts the driving volume (driving current) according to the switching voltage VSW. At the beginning of the transistor turned on, the driving current is smaller for reducing the noises on the input voltage source, and after the transistor has been turned a while, the driving current is bigger for reducing the switching loss, so as to enhance the stability and efficiency of the switching power converter, providing great convenience.

Those skilled in the art will readily observe that numerous modifications and alterations of the device and method may be made while retaining the teachings of the invention.

What is claimed is:

1. A power control circuit for reducing noise and switching loss comprising:
a first gate driver for driving a first switch;
an additional gate driver for driving the first switch;
a managing circuit for controlling the first and the additional gate drivers to drive the first switch according to a switching signal and disabling the additional gate driver according to a switching voltage on a first end of the first switch; and
a voltage detector for detecting the switching voltage and accordingly generating a detecting signal to the managing circuit so that the managing circuit disables the additional gate driver according to the detecting signal;
wherein the first end of the first switch is coupled to a load, a second end of the first switch is coupled to a first power source, and a third end of the first switch is coupled to the first and the additional gate drivers.

2. The power control circuit of claim 1, wherein when the switching voltage is lower than a threshold value, the managing circuit disables the additional circuit, and the managing circuit controls the first gate driver to drive the first switch.

3. The power control circuit of claim 2, wherein the threshold value represents a voltage value at a moment that current of the first switch changes.

4. The power control circuit of claim 2, wherein when the switching voltage is higher than the threshold value, the managing circuit enables the additional gate driver and controls the first and the additional gate drivers according to the switching signal.

5. The power control circuit of claim 1, wherein the first gate driver is an inverter.

6. The power control circuit of claim 1, further comprising:
a second gate driver for driving a second switch;
wherein the managing circuit controls the second gate driver to drive the second switch according to the switching signal;
wherein a first end of the second switch is coupled to the load, a second end of the second switch is coupled to a second power source, a third of the second switch is coupled to the second gate driver so as to allow the second switch to be controlled by the second gate driver.

7. The power control circuit of claim 6, wherein the second gate driver is an inverter.

8. The power control circuit of claim 6, further comprising:
a first on-station detector coupled to the third end of the first switch and the managing circuit for detecting if the first switch is turned on; and
a second on-station detector coupled to the third end of the second switch and the managing circuit for detecting if the second switch is turned on;
wherein the managing circuit controls the first and the second switch not to be turned on at the same time according to detecting results of the first and the second on-station detectors.

9. The power control circuit of claim 1, wherein the first switch is a P type Metal Oxide Semiconductor (PMOS) transistor, and the first power source is an input power source.

10. The power control circuit of claim 1, wherein the first switch is an N type Metal Oxide Semiconductor (NMOS) transistor, and the first power source is a ground end.

11. A switching power converter for reducing noise and switching loss comprising:
a switch set, comprising:
a first switch comprising:
a first end coupled to a load;
a second end coupled to a first power source;
a third end; and
a power control circuit, comprising:
a first gate driver coupled to the third end of the first switch for driving the first switch;
an additional gate driver coupled to the third end of the first switch for driving the first switch; and
a managing circuit for controlling the first and the additional gate drivers to drive the first switch according to a switching signal and disabling the additional gate driver according to a switching voltage on the first end of the first switch.

12. The switching power converter of claim 11, wherein when the switching voltage is lower than a threshold value, the managing circuit disables the additional circuit, and the managing circuit controls the first gate driver to drive the first switch.

13. The switching power converter of claim 12, wherein the threshold value represents a voltage value at a moment that current of the first switch changes.

14. The switching power converter of claim 12, wherein when the switching voltage is higher than the threshold value, the managing circuit enables the additional gate driver and controls the first and the additional gate drivers according to the switching signal.

15. The switching power converter of claim 11, wherein the first gate driver is an inverter.

16. The switching power converter of claim 11, further comprising a voltage detector for detecting the switching voltage and accordingly generating a detecting signal to the managing circuit so that the managing circuit disables the additional gate driver according to the detecting signal.

17. The switching power converter of claim 11, wherein the switch set further comprises:
a second switch, comprising:
a first end coupled to the load;
a second end coupled to a second power source; and
a third end.

18. The switching power converter of claim 17, further comprising:
a second gate driver for driving the second switch;
wherein the managing circuit controls the second gate driver to drive the second switch according to the switching signal;
wherein a first end of the second switch is coupled to the load, a second end of the second switch is coupled to a second power source, a third of the second switch is coupled to the second gate driver so as to allow the second switch to be controlled by the second gate driver.

19. The switching power converter of claim 18, wherein the second gate driver is an inverter.

20. The switching power converter of claim 17, further comprising:
a first on-station detector coupled to the third end of the first switch and the managing circuit for detecting if the first switch is turned on; and
a second on-station detector coupled to the third end of the second switch and the managing circuit for detecting if the second switch is turned on;
wherein the managing circuit controls the first and the second switch not to be turned on at the same time according to detecting results of the first and the second on-station detectors.

21. The switching power converter of claim 11, wherein the first switch is a P type Metal Oxide Semiconductor (PMOS) transistor, and the first power source is an input power source.

22. The switching power converter of claim 11, wherein the first switch is an N type Metal Oxide Semiconductor (NMOS) transistor, and the first power source is a ground end.

* * * * *